United States Patent
Horikoshi

(10) Patent No.: US 9,608,030 B2
(45) Date of Patent: Mar. 28, 2017

(54) SOLID-STATE IMAGING APPARATUS, METHOD OF MANUFACTURING THE SAME, AND ELECTRONIC APPARATUS

(71) Applicant: Sony Semiconductor Solutions Corporation, Kanagawa (JP)

(72) Inventor: Hiroshi Horikoshi, Kumamoto (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 168 days.

(21) Appl. No.: 14/338,929

(22) Filed: Jul. 23, 2014

(65) Prior Publication Data

US 2015/0035104 A1    Feb. 5, 2015

(30) Foreign Application Priority Data

Jul. 30, 2013 (JP) .................. 2013-157934

(51) Int. Cl.
*H01L 27/146* (2006.01)

(52) U.S. Cl.
CPC .. *H01L 27/14685* (2013.01); *H01L 27/14623* (2013.01); *H01L 27/14627* (2013.01); *H01L 27/14621* (2013.01)

(58) Field of Classification Search
CPC ................................... H01L 27/14627
See application file for complete search history.

(56) References Cited

U.S. PATENT DOCUMENTS

| | | | |
|---|---|---|---|
| 2008/0135732 A1* | 6/2008 | Toumiya | H01L 27/14625 250/208.1 |
| 2013/0021499 A1* | 1/2013 | Ui | G03B 13/36 348/238 |

FOREIGN PATENT DOCUMENTS

| | | |
|---|---|---|
| JP | 2000-164837 A | 6/2000 |
| JP | 2009-158944 A | 7/2009 |

\* cited by examiner

*Primary Examiner* — Fernando L Toledo
*Assistant Examiner* — Valerie N Newton
(74) *Attorney, Agent, or Firm* — Sheridan Ross P.C.

(57) ABSTRACT

A solid-state imaging apparatus includes an imaging region in which pixels are arranged, a connection region that surrounds the imaging region and includes an electrode pad, and an in-layer lens that is formed in the imaging region for each of the pixels. The in-layer lens is formed of a coating-type high-refractive-index material. The connection region includes an opening that is formed such that an upper surface of the electrode pad is exposed from the high-refractive-index material applied to the electrode pad.

2 Claims, 18 Drawing Sheets

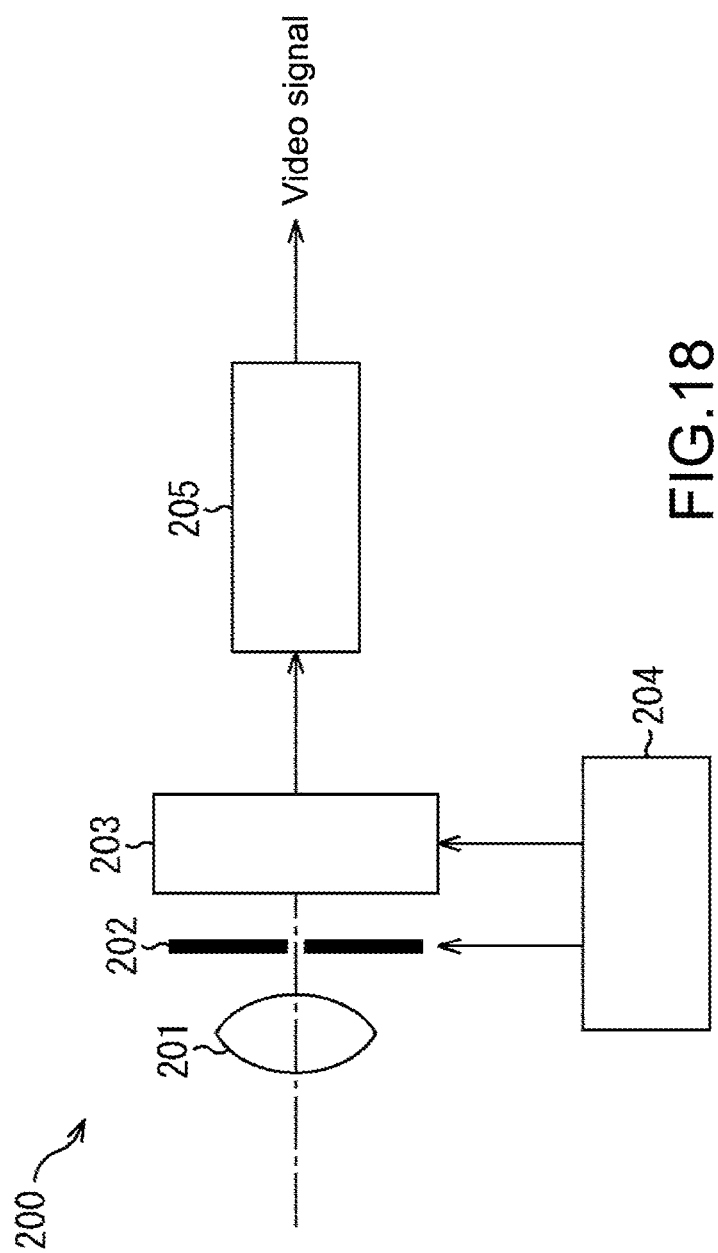

SOLID-STATE IMAGING APPARATUS, METHOD OF MANUFACTURING THE SAME, AND ELECTRONIC APPARATUS

CROSS REFERENCE TO RELATED APPLICATIONS

This application claims the benefit of Japanese Priority Patent Application JP 2013-157934 filed Jul. 30, 2013, the entire contents of which are incorporated herein by reference.

BACKGROUND

The present disclosure relates to a solid-state imaging apparatus, a method of manufacturing the same, and an electronic apparatus and more particularly to a solid-state imaging apparatus, a method of manufacturing the same, and an electronic apparatus by which favorable light collecting properties can be provided.

In recent years, a solid-state imaging apparatus in a digital camera or the like is downsized and includes more pixels due to pixel miniaturization. Specifically, a photoelectric conversion section (light reception section) of each pixel is reduced in area. A micro lens serving as a light collection section is also reduced in size along with the reduction in area of the light reception section.

There is known a solid-state imaging apparatus including, in addition to a micro lens formed in an uppermost layer of a light input surface, an in-layer lens (inner lens) formed of a high-refractive-index material between the micro lens and a light reception section for the purpose of improving the light collecting properties of pixels.

For example, there is a solid-state imaging apparatus including an in-layer lens in a wiring layer (e.g., see Japanese Patent Application Laid-open No. 2000-164837 (hereinafter, referred to as Patent Document 1)). In this case, the in-layer lens is formed on a planarized inter-layer insulating film, and hence the in-layer lens can be formed without being influenced by a step. However, a distance between the in-layer lens and a micro lens in an uppermost layer is relatively long. Thus, for providing favorable light collecting properties, it is necessary to achieve precise structural design.

In this context, there is a solid-state imaging apparatus including an in-layer lens on a wiring layer (e.g., see Japanese Patent Application Laid-open No. 2009-158944 (hereinafter, referred to as Patent Document 2)). With this structure, the distance between the in-layer lens and the micro lens can be shortened.

SUMMARY

With the structure like the solid-state imaging apparatus of Patent Document 2, a step is formed due to a wire (electrode pad). Therefore, it is necessary to reduce such a step when the in-layer lens is formed. However, the distance between the in-layer lens and the light reception section is correspondingly increased and light input into the light reception section is reduced.

Further, a color filter formed in a layer above the in-layer lens has to be formed in a flat region. Therefore, even when the in-layer lens is formed without reducing the above-mentioned step, a planarization film has to be formed in a layer above the in-layer lens and the electrode pad. Thus, the distance between the in-layer lens and the micro lens correspondingly increases, which deteriorates the light collecting properties.

In view of the above-mentioned circumstances, it is desirable to provide more favorable light collecting properties.

According to an embodiment of the present disclosure, there is provided a solid-state imaging apparatus including: an imaging region in which pixels are arranged; a connection region that surrounds the imaging region and includes an electrode pad; and an in-layer lens that is formed in the imaging region for each of the pixels, the in-layer lens being formed of a coating-type high-refractive-index material, the connection region including an opening that is formed such that an upper surface of the electrode pad is exposed from the high-refractive-index material applied to the electrode pad.

The solid-state imaging apparatus may further include: a planarization film that is formed on the high-refractive-index material; and a color filter and a micro lens that are formed on the planarization film in the imaging region for each of the pixels. The opening may be formed by etching materials of the planarization film and the micro lens in the connection region.

The upper surface of the electrode pad may be partially in contact with the planarization film.

The imaging region may include, as one of the pixels, a phase difference detection pixel having a light reception surface partially shielded from light.

The micro lens of the phase difference detection pixel may be formed to have a curvature smaller than a curvature of the micro lenses of the other pixels.

The in-layer lens of the phase difference detection pixel may be formed to have a curvature smaller than a curvature of the in-layer lenses of the other pixels.

The solid-state imaging apparatus may further include a passivation layer. The high-refractive-index material may be applied to the passivation layer.

The high-refractive-index material may contain a metal oxide film particle.

According to an embodiment of the present disclosure, there is provided a method of manufacturing a solid-state imaging apparatus including an imaging region in which pixels are arranged, a connection region that surrounds the imaging region and includes an electrode pad, and an in-layer lens that is formed in the imaging region for each of the pixels, the method including: forming the in-layer lens by etching back the coating-type high-refractive-index material; and forming, in the connection region, an opening such that the upper surface of the electrode pad is exposed by etching back the high-refractive-index material applied to the electrode pad.

In etching back the high-refractive-index material applied to the electrode pad, an emission wavelength caused by the electrode pad being attacked by plasma may be monitored.

The high-refractive-index material on the electrode pad may be set to have a thickness smaller than a thickness corresponding to an etching amount in etching back the high-refractive-index material.

According to an embodiment of the present disclosure, there is provided an electronic apparatus including: an imaging region in which pixels are arranged; a connection region that surrounds the imaging region and includes an electrode pad; and an in-layer lens that is formed in the imaging region for each of the pixels, the in-layer lens being formed of a coating-type high-refractive-index material, the connection region including an opening that is formed such that an upper surface of the electrode pad is exposed from the high-refractive-index material applied to the electrode pad.

In the embodiment of the present disclosure, the in-layer lens is formed of the coating-type high-refractive-index material and the connection region includes the opening formed such that the upper surface of the electrode pad is exposed from the high-refractive-index material applied to the electrode pad.

According to an embodiment of the present disclosure, it is possible to provide more favorable light collecting properties.

These and other objects, features and advantages of the present disclosure will become more apparent in light of the following detailed description of best mode embodiments thereof, as illustrated in the accompanying drawings.

BRIEF DESCRIPTION OF DRAWINGS

FIG. 18 is a block diagram showing a configuration example of an electronic apparatus according to an embodiment of the present disclosure.

DETAILED DESCRIPTION OF EMBODIMENTS

Hereinafter, embodiments of the present disclosure will be described with reference to the drawings.
[Configuration of Solid-State Imaging Apparatus]

Figure 1:
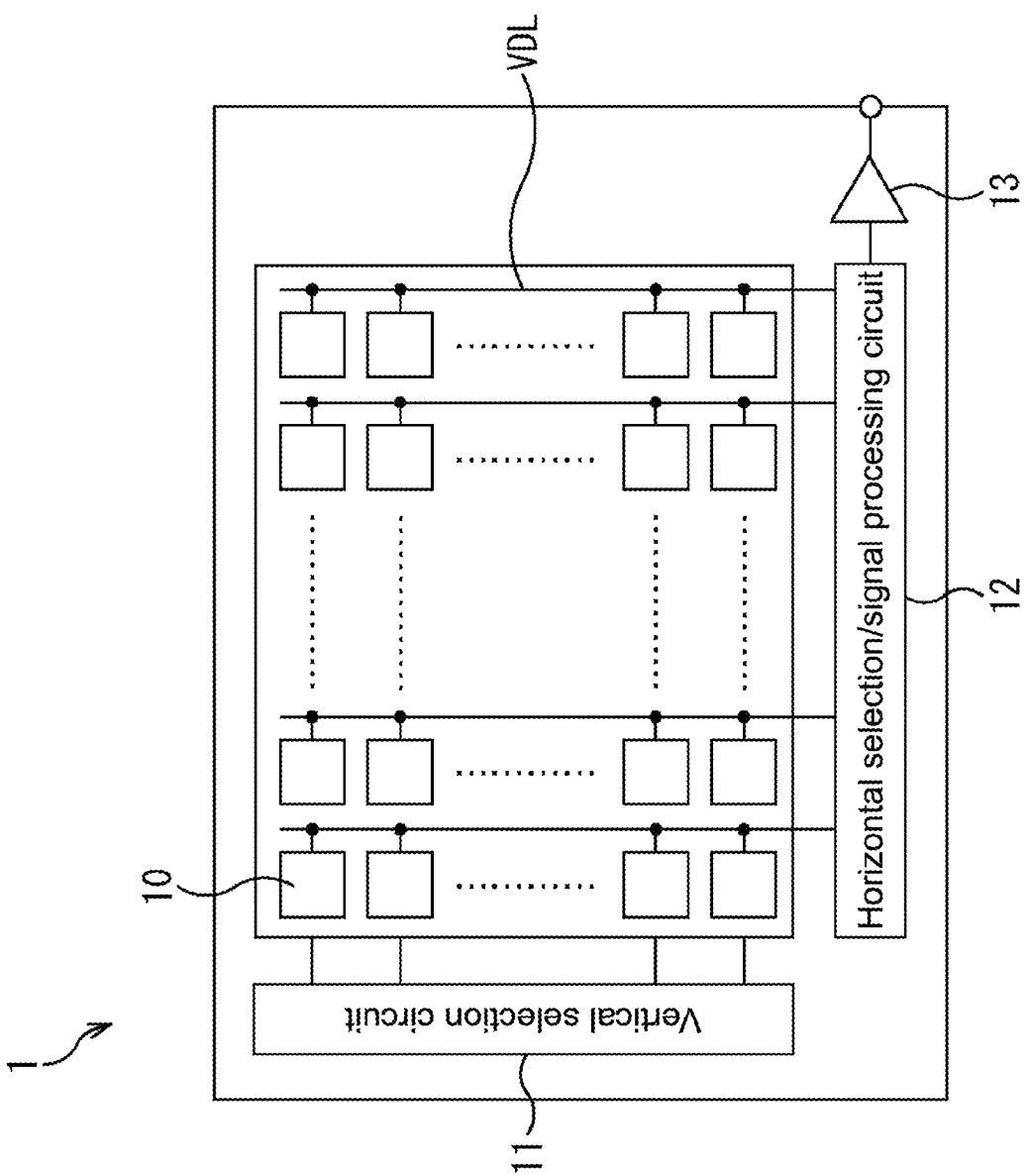
FIG. 1 is a block diagram showing a configuration example of a solid-state imaging apparatus according to an embodiment of the present disclosure.

FIG. 1 is a block diagram showing a configuration example of a solid-state imaging apparatus according to an embodiment of the present disclosure.

A solid-state imaging apparatus 1 is configured as a front side illumination complementary metal oxide semiconductor (CMOS) image sensor and includes a plurality of pixels 10, vertical signal lines VDL, a vertical selection circuit 11, a horizontal selection/signal processing circuit 12, and an output circuit 13.

The pixels 10 are arranged in a matrix form on a semiconductor substrate such as a Si substrate. Each of the pixels 10 includes a light reception section (photodiode) that generates charges depending on a light reception amount and a pixel circuit including various pixel transistors.

The vertical signal lines VDL are wires that transmit signals depending on charges generated in the pixels 10 to the horizontal selection/signal processing circuit 12 and extend along a vertical direction (column direction).

The vertical selection circuit 11 is a circuit that selects the pixels 10 for each row and sequentially scans along the vertical direction.

The horizontal selection/signal processing circuit 12 includes a circuit that selects the pixels 10 for each column and sequentially scans along a horizontal direction and a circuit that processes signals received via the vertical signal lines VDL. The horizontal selection/signal processing circuit 12 sequentially selects the pixels 10 along the horizontal direction in synchronization of scanning by the vertical selection circuit 11. According to a selection order, the signals of the pixels 10 are sequentially transmitted to the horizontal selection/signal processing circuit 12 via the vertical signal lines VDL. The horizontal selection/signal processing circuit 12 transmits the sequentially received signals of the pixels 10 to the output circuit 13.

The output circuit 13 performs various types of signal processing on the signals of the pixels 10 sequentially received from the horizontal selection/signal processing circuit 12 and outputs the processed signals.
[Plan View of Solid-State Imaging Apparatus]

Figure 2:
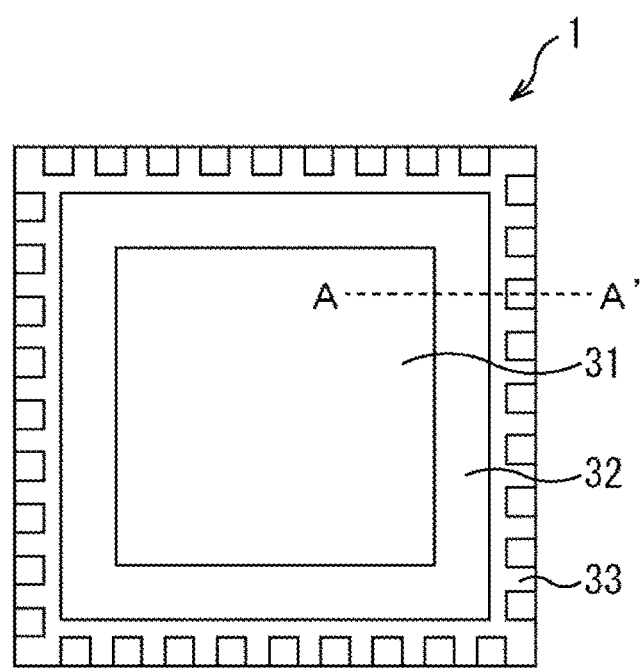
FIG. 2 is a plan view showing a configuration example of the solid-state imaging apparatus according to the embodiment of the present disclosure.

FIG. 2 is a plan view of the solid-state imaging apparatus 1.

The solid-state imaging apparatus 1 includes, in a light reception surface thereof, an imaging region 31, a peripheral circuit region 32, and an external connection region 33.

The imaging region 31 is a rectangular region. In this region, the plurality of pixels 10 described above are arranged in a matrix form.

The peripheral circuit region 32 is formed in a rectangular shape surrounding the imaging region 31. In this region, the above-mentioned vertical selection circuit 11 and horizontal selection/signal processing circuit 12 are placed.

The external connection region 33 is formed in a rectangular shape surrounding the peripheral circuit region 32. In this region, an electrode pad that electrically connects the solid-state imaging apparatus 1 to an external circuit and a wire that is connected to the electrode pad are placed.
[Cross-Sectional View of Solid-State Imaging Apparatus]

Figure 3:
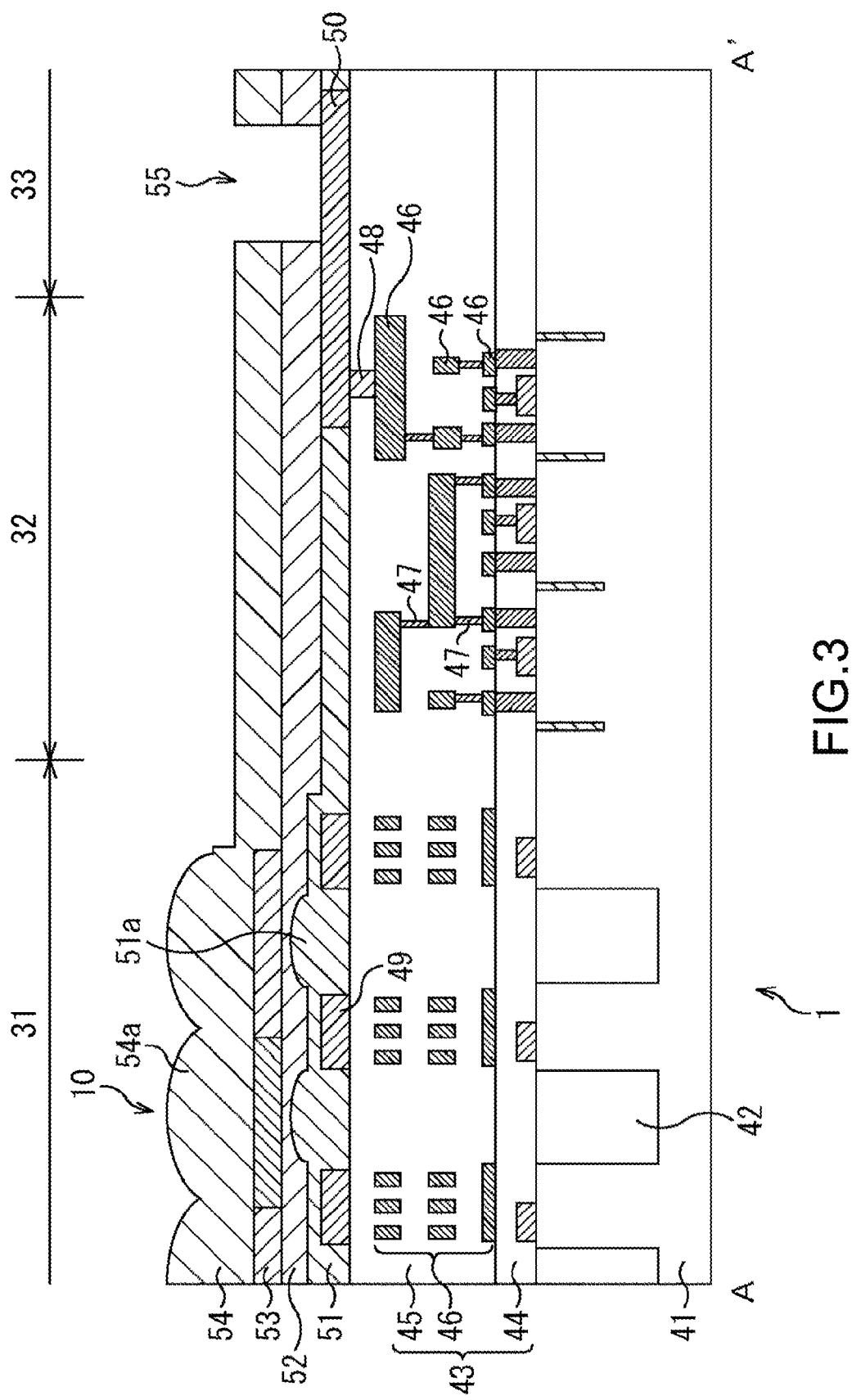
FIG. 3 is a cross-sectional view showing a configuration example of the solid-state imaging apparatus according to the embodiment of the present disclosure.

FIG. 3 is a cross-sectional view of the solid-state imaging apparatus 1 taken along the line A-A' of FIG. 2.

As shown in FIG. 3, in the solid-state imaging apparatus 1, photodiodes 42 each serving as the light reception section are formed in a semiconductor substrate 41 made of Si or the like.

A stacked wiring layer 43 is formed on the semiconductor substrate 41. The stacked wiring layer 43 is formed of inter-layer insulation films 44 and 45 and a plurality of wiring layers 46. The inter-layer insulation films 44 and 45 are formed of a silicon dioxide film made of $SiO_2$, for example. The wiring layers 46 are formed of a plurality of metals (wiring material) and connected to one another via plugs 47 and 48 or the like formed between the layers. For example, the wiring layers 46 are made of Al alloy and barrier metal (Ti, TiN, etc.) in the case of an Al wire and made of Cu and barrier metal (Ta, TaN, etc.) in the case of a Cu wire.

In addition, wiring layers 49 are formed on the stacked wiring layer 43 in the imaging region 31. An electrode pad 50 is formed on the stacked wiring layer 43 in the external connection region 33 and part of the peripheral circuit region 32. The wiring layers 49 and the electrode pad 50 are formed of the same kind of metal, for example, Al. Alternatively, the wiring layers 49 and the electrode pad 50 may be formed of different kinds of metal.

A high-refractive-index layer 51 is formed on the wiring layers 49. An in-layer lens 51a is formed for each pixel 10 as part of the high-refractive-index layer 51. The high-refractive-index layer 51 including the in-layer lenses 51a is formed of a coating-type high-refractive-index material. Note that an upper surface of the electrode pad 50 is exposed from the high-refractive-index layer 51.

A planarization film 52 is formed on the high-refractive-index layer 51. A color filter 53 is formed on the planarization film 52 in the imaging region 31 for each pixel 10. A micro lens material 54 is formed on the planarization film 52 and the color filter 53. A micro lens 54a is formed for each pixel 10 as part of the micro lens material 54.

Further, an opening 55 for electrically connecting the electrode pad 50 to an external circuit is provided in the external connection region 33. The opening 55 is formed by etching the planarization film 52 and the micro lens material 54.

As described above, the upper surface of the electrode pad 50 is exposed from the high-refractive-index layer 51, and hence, in a region other than the region of the opening 55, the upper surface of the electrode pad 50 is in contact with the planarization film 52.

Next, before processes of forming the in-layer lenses 51a in processes of manufacturing the solid-state imaging apparatus 1 will be described, traditional processes of forming in-layer lenses in the solid-state imaging apparatus will be described.

[Traditional Formation of In-Layer Lens]

First, referring to FIG. 4, the traditional processes of forming the in-layer lenses in the solid-state imaging apparatus will be described. Note that, in FIG. 4, processes after an electrode pad 50 is formed will be described.

After the electrode pad 50 is formed, a passivation layer (not shown) is formed by chemical vapor deposition (CVD). As shown in A of FIG. 4, a high-refractive-index layer 71 having a high refractive index is formed.

In the traditional technique, a silicon nitride film, a silicon oxynitride film, or the like formed by CVD is used as the high-refractive-index layer 71. The high-refractive-index layer 71 formed by CVD is formed to conform to steps of a deposition target base material. Therefore, the high-refractive-index layer 71 is formed to have a thickness equal to a set thickness also on the electrode pad 50.

Figure 4:
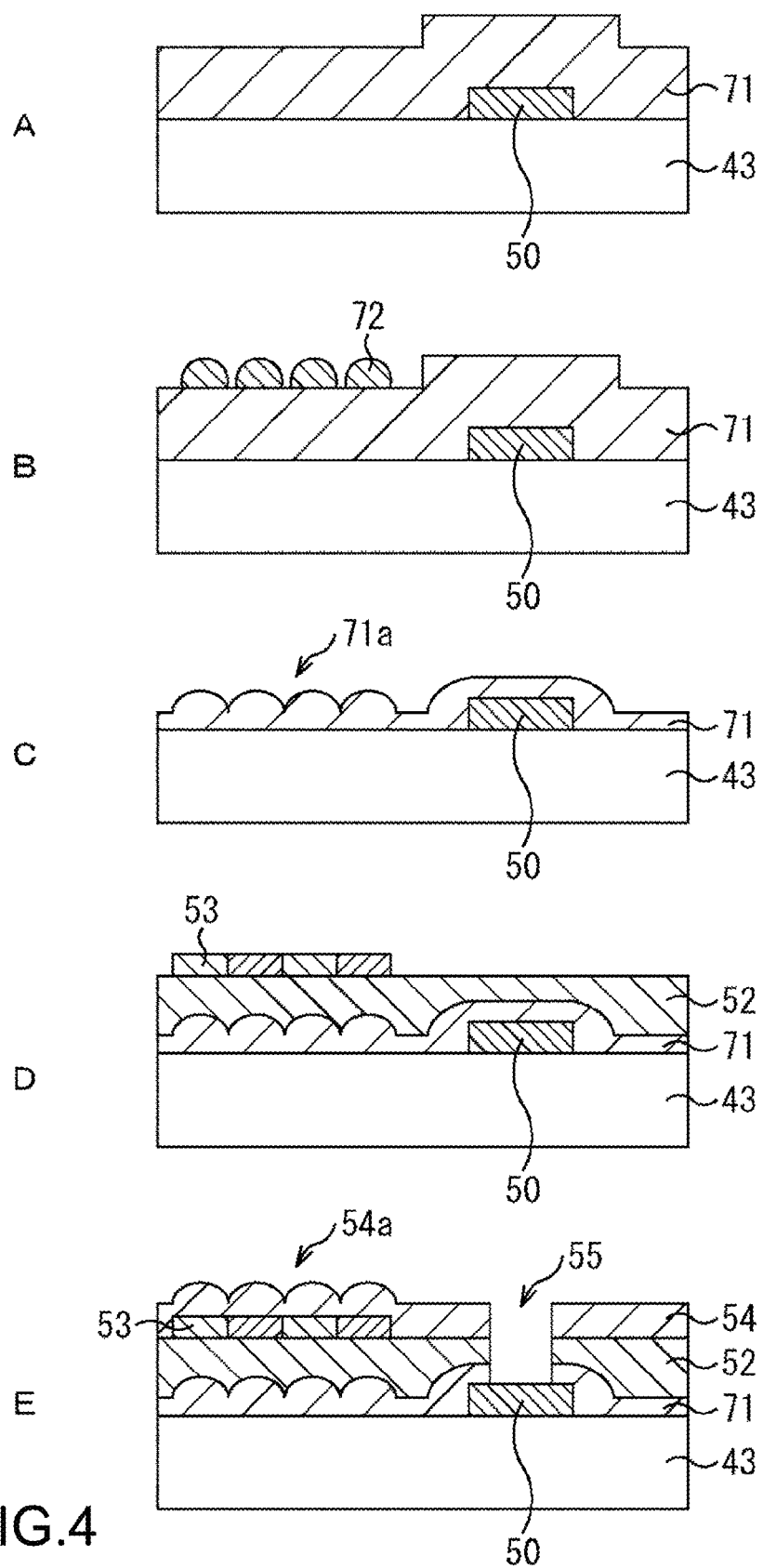
FIG. 4 is a view showing traditional processes of forming in-layer lenses.

After the state shown in A of FIG. 4, resist for forming the in-layer lens is formed on the high-refractive-index layer 71. After the resist is formed, a lens pattern is formed by lithography. By thermal treatment (reflow), spherical resist 72 is formed as shown in B of FIG. 4.

After the state shown in B of FIG. 4, etching-back is performed on the entire surface by dry etching, and the spherically formed resist 72 is transferred to the high-refractive-index layer 71. As a result, in-layer lenses 71a are formed as shown in C of FIG. 4.

After that, as shown in D of FIG. 4, the planarization film 52 is formed on the high-refractive-index layer 71 and a color filter material is applied to the planarization film 52, exposed to light, and developed. As a result, color filters 53 are formed. Although three kinds of color filters of R (red), G (green), and B (blue) are formed as the color filters 53, color filters of other colors may be formed.

If the region in which the color filters 53 are formed is not flat, the color filters 53 are not evenly formed due to application unevenness and the performance of the color filters 53 varies in an imaging surface. Therefore, the region in which the color filters 53 are formed is made flat without steps by the planarization film 52.

Further, as described above, the high-refractive-index layer 71 formed by CVD is conformally formed, and hence the large step is formed due to the electrode pad 50. Therefore, by forming the planarization film 52 to be thick, such a step is overcome.

Then, as shown in E of FIG. 4, the micro lenses 54a and the opening 55 are formed. Although reflow, etching-back, nanoimprint, or the like is used as a method of forming the micro lenses 54a, the method is not limited thereto. Further, regarding the opening 55, the micro lens material 54, the planarization film 52, and the high-refractive-index layer 71 are etched by dry etching after resist formation, exposure, and development. As a result, the upper surface of the electrode pad 50 is exposed.

Various materials such as an inorganic film and an organic film are used for the micro lens material 54, the planarization film 52, and the high-refractive-index layer 71 that are etching target layers, the antireflection material (not shown), and the like. Thus, in dry etching the opening 55, the process stability can be improved by reducing the number of films and layers as much as possible.

[Formation of in-Layer Lens According to Embodiment of Present Disclosure]

Figure 5:
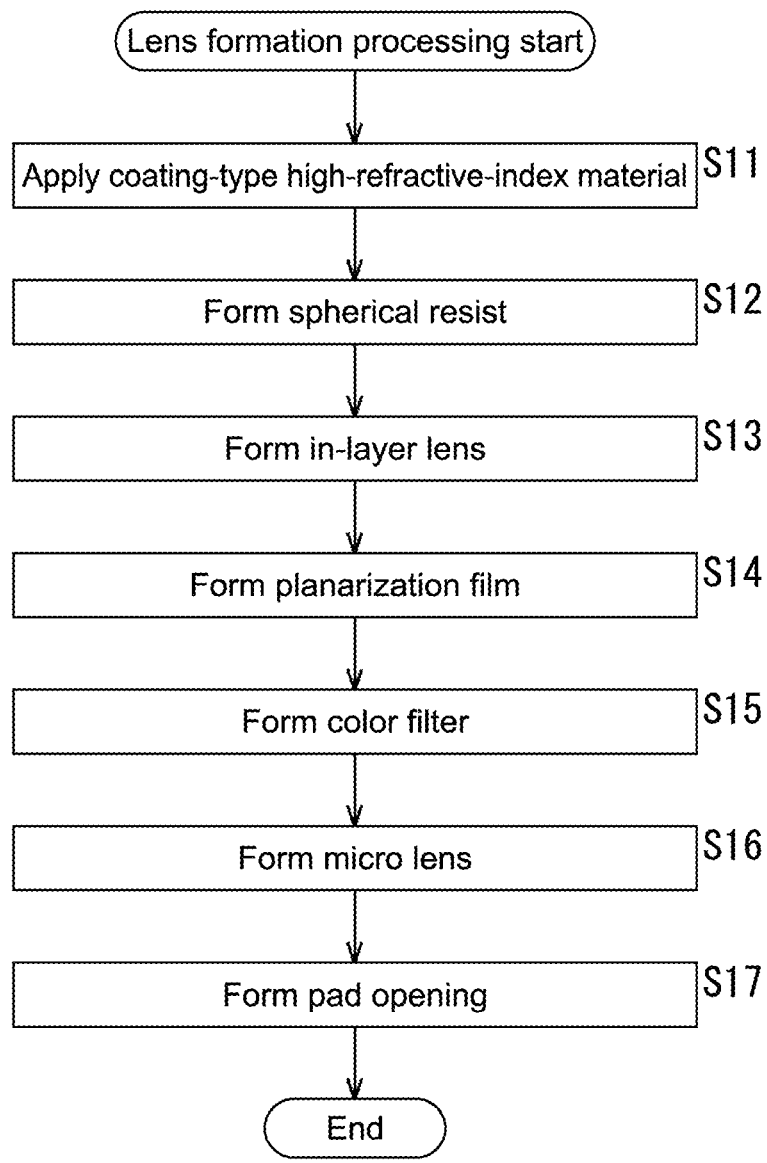
FIG. 5 is a flowchart explaining processes of forming an in-layer lens according to the embodiment of the present disclosure.
Figure 6:
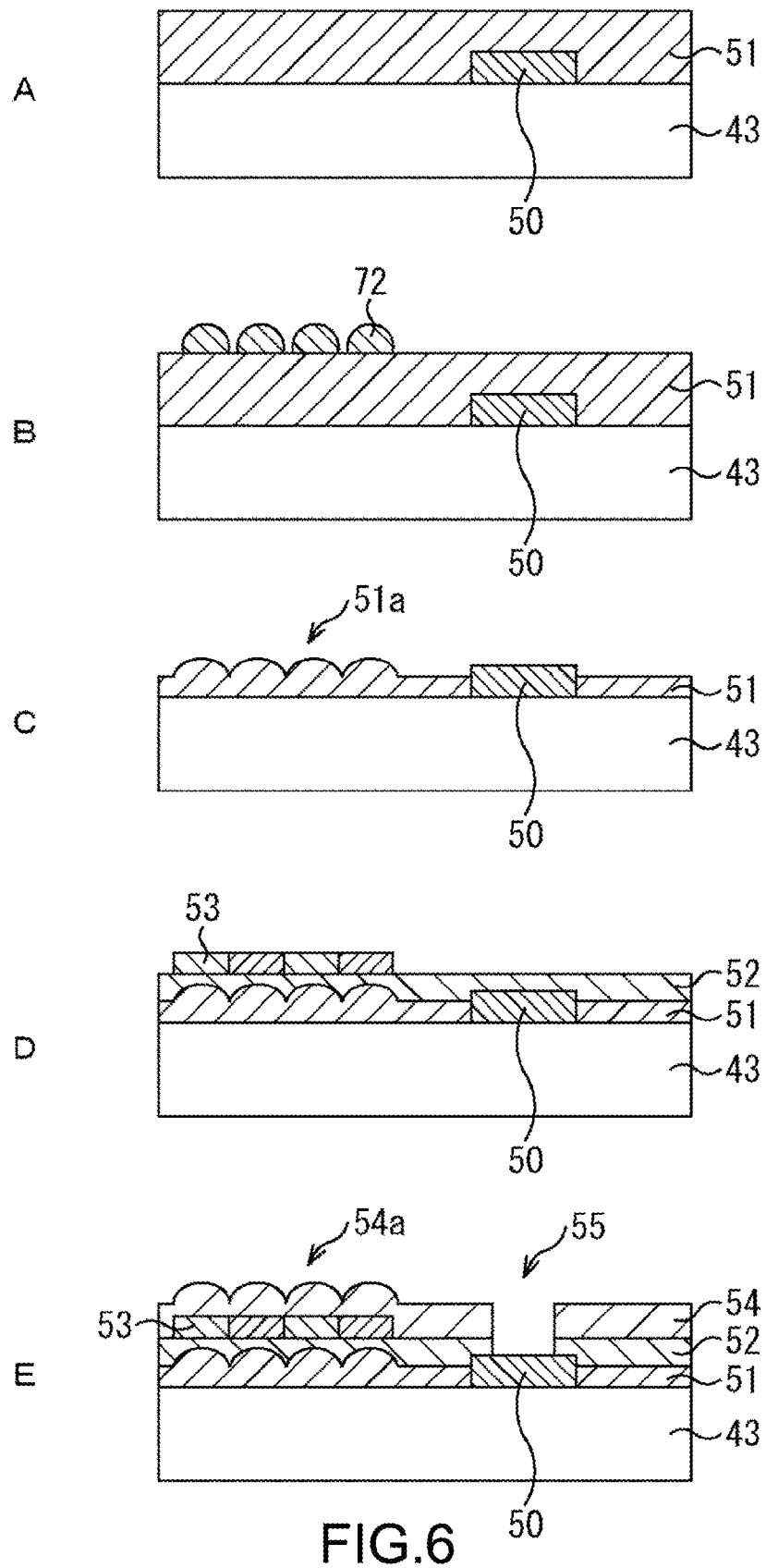
FIG. 6 is a view showing processes of forming the in-layer lens according to the embodiment of the present disclosure.

Next, referring to FIGS. 5 and 6, processes of forming the in-layer lens in the solid-state imaging apparatus according to the embodiment of the present disclosure will be described. FIG. 5 is a flowchart explaining the processes of forming the in-layer lenses 51a. FIG. 6 is a diagram explaining the processes of forming the in-layer lenses 51a. Note that, also in FIGS. 5 and 6, the processes after the electrode pad 50 is formed will be described.

When the electrode pad 50 is formed and then the passivation layer (not shown) is formed by CVD, a coating-type high-refractive-index material is applied in Step S11. With this, as shown in A of FIG. 6, the high-refractive-index layer 51 is formed.

Although a siloxane-based material containing transparent metal oxide film particles, for example, TiOx or ZnOx is used as the coating-type high-refractive-index material, the material is not limited thereto. The refractive index of the high-refractive-index material is set to be higher than 1.4 to 1.6 that is the refractive index of a material generally used as a light path. It is desirable that the refractive index of the high-refractive-index material be 1.8 or higher.

The high-refractive-index layer 51 is formed by, for example, spin coat. The thickness of the high-refractive-index layer 51 is set to be larger than the height of the electrode pad 50. However, the thickness of the high-refractive-index layer 51 is optimized depending on the height of the electrode pad 50 and a desired height of the in-layer lenses 51a. Note that the height of the electrode pad 50 may be changed depending on the height of the in-layer lenses 51a.

The high-refractive-index layer 51 is formed by coating, and hence the step due to the electrode pad 50 can be overcome by the high-refractive-index material. In addition, the thickness of the high-refractive-index layer 51 on the electrode pad 50 can be reduced. Thus, the high-refractive-index layer 51 is formed such that the step due to the electrode pad 50 is planarized.

After Step S11, resist for forming the in-layer lenses 51a is formed on the high-refractive-index layer 51. After the resist is formed, in Step S12, by forming the lens pattern by lithography and performing thermal treatment (reflow), the spherical resist 72 is formed as shown in B of FIG. 6.

Also here, the surface of the high-refractive-index layer 51 has not step, and hence the application unevenness when the resist is applied is reduced. Thus, the spherical resist 72 can be evenly formed in the imaging surface.

In Step S13, etching-back is performed on the entire surface by dry etching and the resist 72 formed in a spherical shape is transferred to the high-refractive-index layer 51. As a result, the in-layer lenses 51a are formed as shown in C of FIG. 6.

As described above, the thickness of the high-refractive-index material (high-refractive-index layer 51) on the electrode pad 50 is small. Therefore, in this etching-back process, an etching amount can be adjusted by sensing the exposure of the electrode pad 50.

Figure 7:
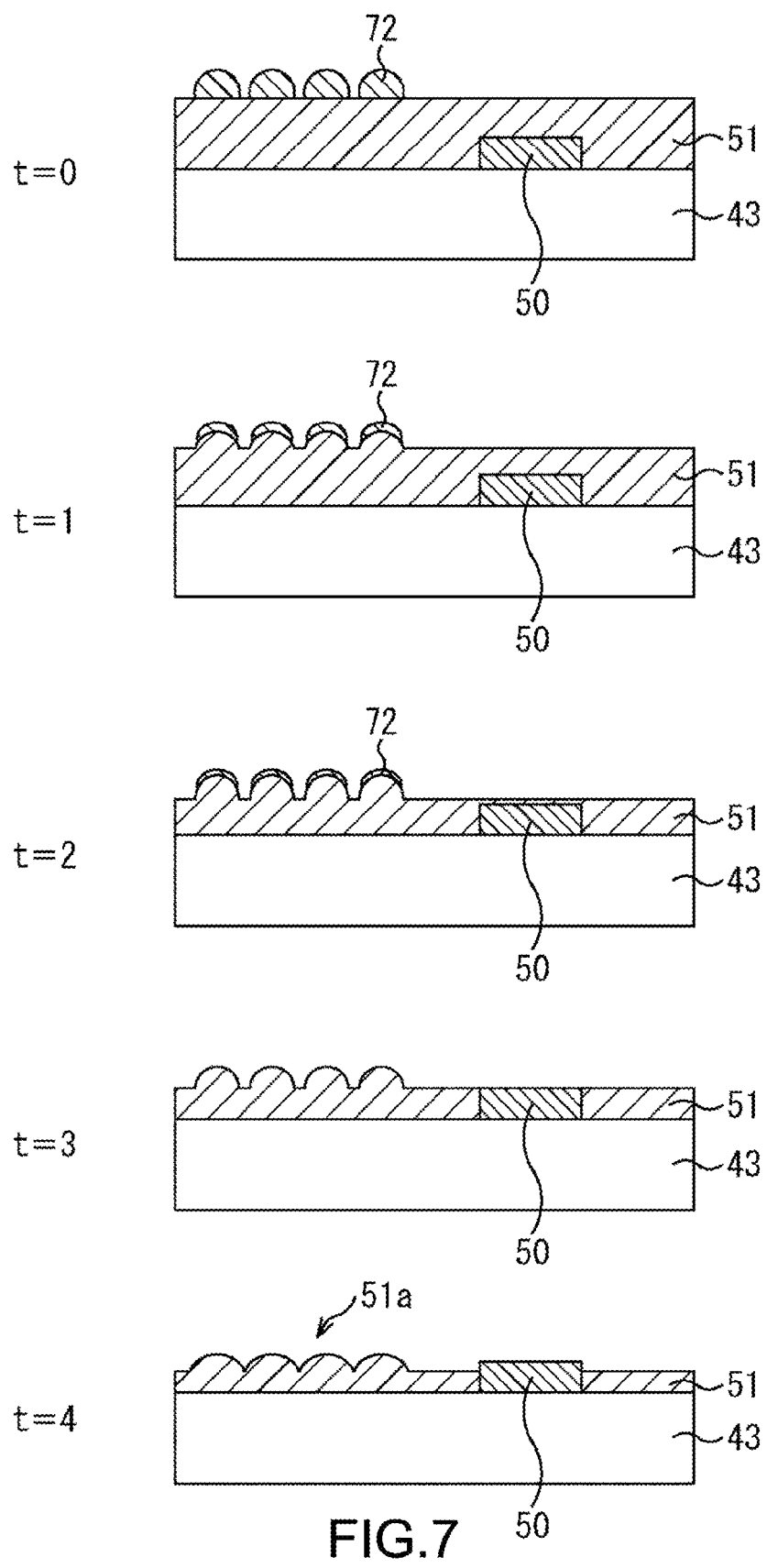
FIG. 7 is a view showing processes of forming the in-layer lens according to the embodiment of the present disclosure.

Now, referring to FIG. 7, etching-back in Step S13 will be described in detail. In FIG. 7, assuming that the state shown in B of FIG. 6 is indicated by a point of time t=0 and the state shown in C of FIG. 6 is indicated by a point of time t=4, a change of the high-refractive-index layer 51 at the point of time t=1 to the point of time t=4 will be described.

Note that the kind of etching gas used in etching is $CF_4$, fluorocarbon gas of $C_4F_8$ or the like, $O_2$, or the like.

When etching-back is started from the state at the point of time t=0, the resist 72 is etched in portions of the in-layer lenses and also in portions on which the resist is not formed in the state at the point of time t=1. Therefore, the high-refractive-index layer 51 below the resist 72, which is not covered with the resist 72, is etched such that the pattern of the resist 72 is transferred. Note that the resist 72 is not formed on the electrode pad 50, and hence the thickness of the high-refractive-index layer 51 on the electrode pad 50 becomes smaller in comparison with the state at the point of time t=0.

In a state at a point of time t=2, the transfer of the resist 72 progresses in the high-refractive-index layer 51 below the resist 72 and the thickness of the high-refractive-index layer 51 on the electrode pad 50 becomes further smaller.

Then, in a state at a point of time t=3, the high-refractive-index layer 51 on the electrode pad 50 is entirely etched and the electrode pad 50 is exposed, and hence the electrode pad 50 (Al) is etched (attached by plasma). At this time, reactant and product ion/radical species between Al and ion/radical in the plasma during etching are scattered.

In dry etching, ion/radical species is generally monitored. Ion/radical species are monitored by an end point detector (EPD) provided to an etching apparatus. An emission wavelength in plasma is determined based on the ion/radical species, and hence the endpoint detection, that is, detection of exposure (etching) of the electrode pad 50 is performed by monitoring the emission wavelength in plasma.

When predetermined over-etching is conducted after the endpoint detection is performed by the EPD in the state at the point of time t=3, a state at the point of time t=4 is obtained. The etching amount of over-etching depends on a desired lens shape. For example, in order to form a high-curvature lens, over-etching is conducted for a long time.

By the way, in etching-back described above with reference to FIG. 7, a relationship between the thickness of the high-refractive-index material (high-refractive-index layer 51) on the electrode pad 50 and the etching amount of etching-back is important for the endpoint detection by the EPD.

Figure 8:
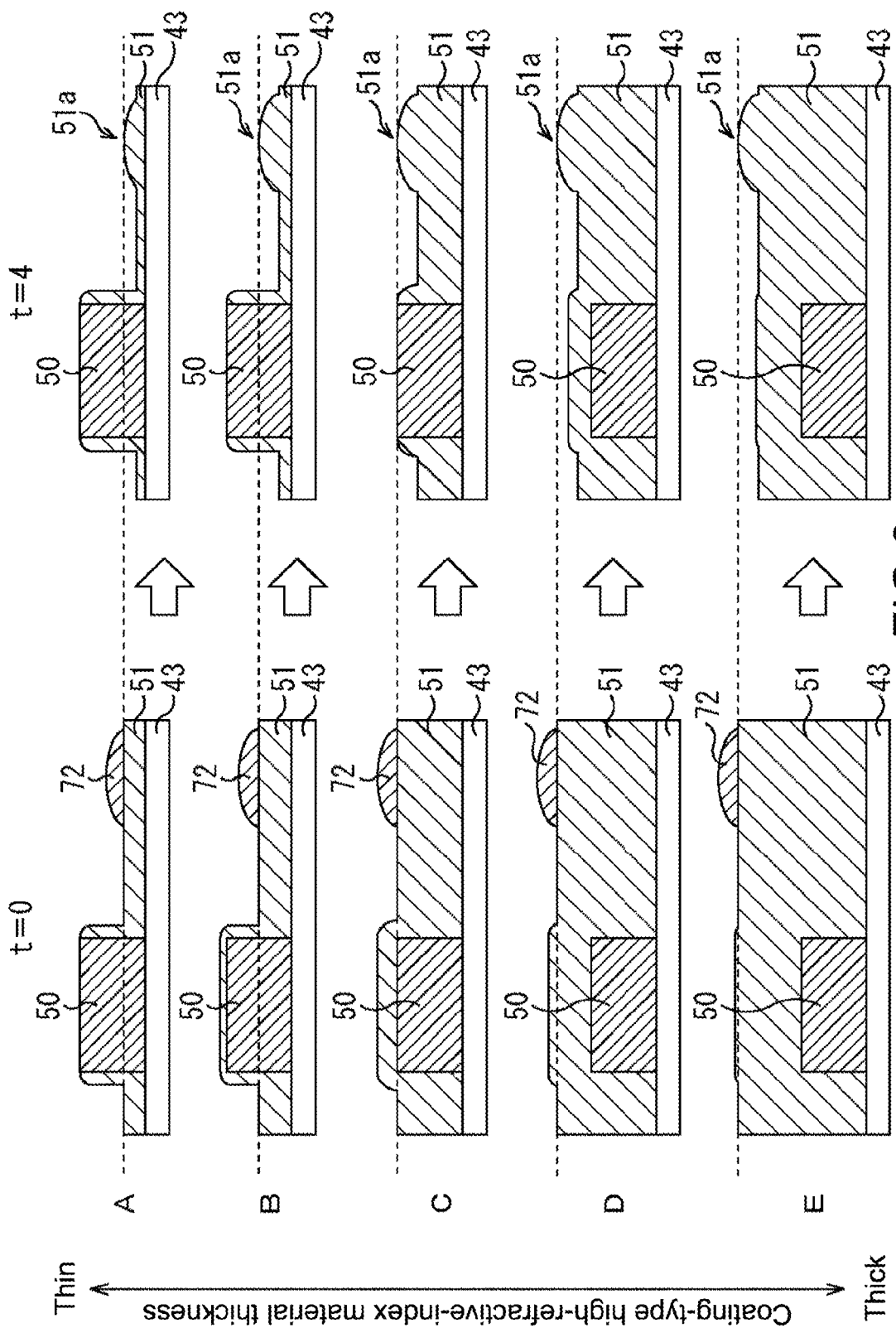
FIG. 8 is a view explaining a relationship between a thickness of a high-refractive-index material on an electrode pad and an etching amount.

FIG. 8 shows a state at the start of etching-back (point of time t=0) and a state at the end of etching-back (point of time t=4) in the case where the height of the electrode pad 50 is fixed and the thickness of the high-refractive-index material is changed. A of FIG. 8 shows the case where the thickness of the high-refractive-index material is set to be smallest. E of FIG. 8 shows the case where the thickness of the high-refractive-index material is set to be largest.

In the case of A of FIG. 8, the thickness of the high-refractive-index material is too small at the point of time t=0, and hence the endpoint detection by the EPD has no margin and the in-layer lenses 51a cannot be formed in a desired lens shape.

In the cases of B and C of FIG. 8, the thickness of the high-refractive-index material at the point of time t=0 is suitable and the endpoint detection by the EPD is suitably performed, and hence the in-layer lenses 51a can be formed in a desired lens shape.

In the cases of D and E of FIG. 8, the thickness of the high-refractive-index material at the point of time t=0 is too large, and hence the endpoint detection by the EPD cannot be performed.

Figure 9:
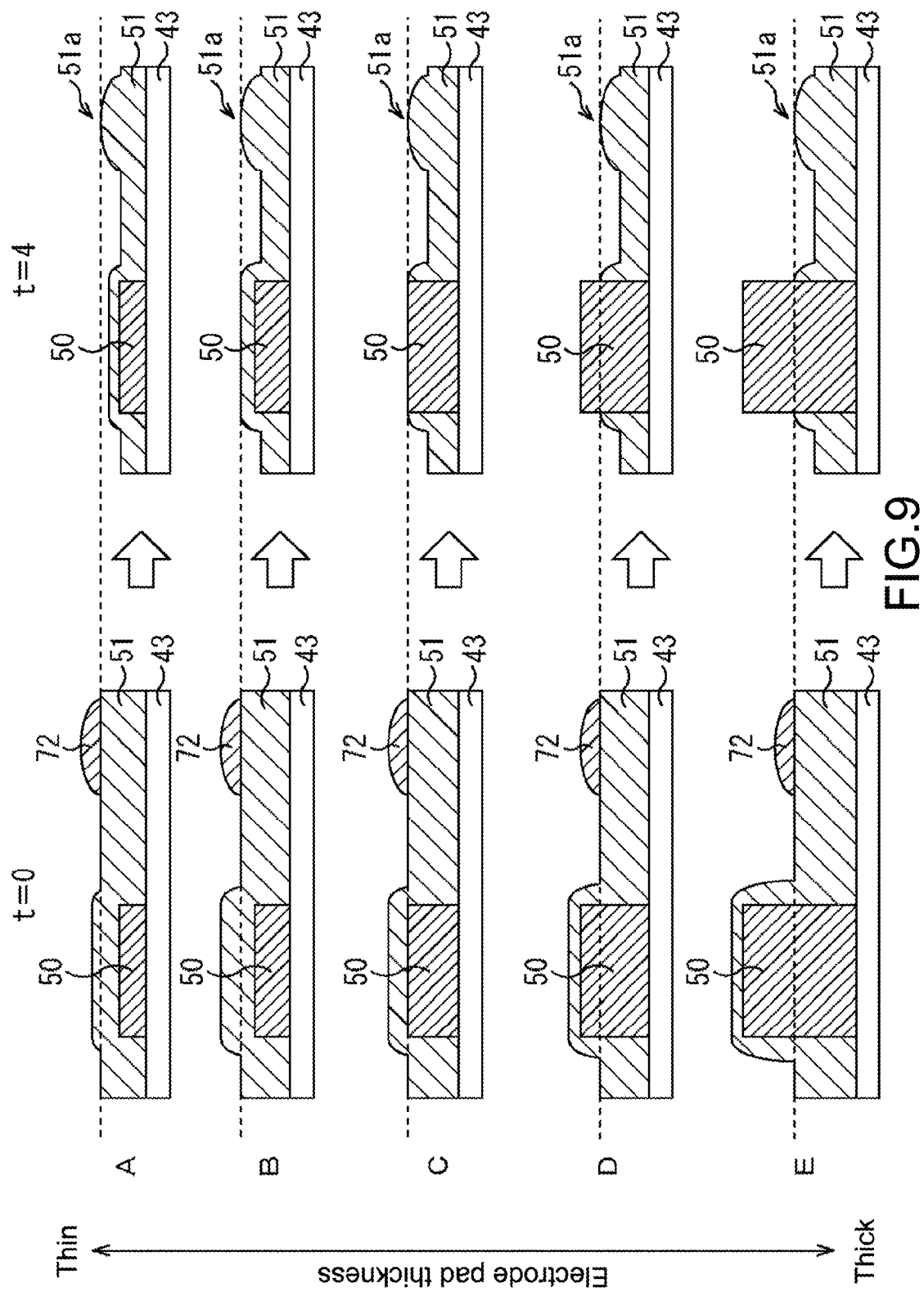
FIG. 9 is a view explaining the relationship between the thickness of the high-refractive-index material on the electrode pad and the etching amount.

FIG. 9 shows a state at the start of etching-back (point of time t=0) and a state at the end of etching-back (point of time t=4) in the case where the thickness of the high-refractive-index material is fixed and the height (thickness) of the electrode pad 50 is changed. A of FIG. 9 shows the case where the thickness of the electrode pad 50 is set to be smallest. E of FIG. 9 shows the case where the thickness of the electrode pad 50 is largest.

In the cases of A and B of FIG. 9, the thickness of the high-refractive-index material at the point of time t=0 is too large, and the endpoint detection by the EPD cannot be performed.

In the case of C of FIG. 9, the thickness of the high-refractive-index material at the point of time t=0 is suitable and the endpoint detection by the EPD is suitably performed, and hence the in-layer lenses 51a can be formed in a desired lens shape.

In the cases of D and E of FIG. 9, the thickness of the high-refractive-index material at the point of time t=0 is too small, and hence the endpoint detection by the EPD has no margin and the in-layer lenses 51a cannot be formed in a desired lens shape.

Figure 10:
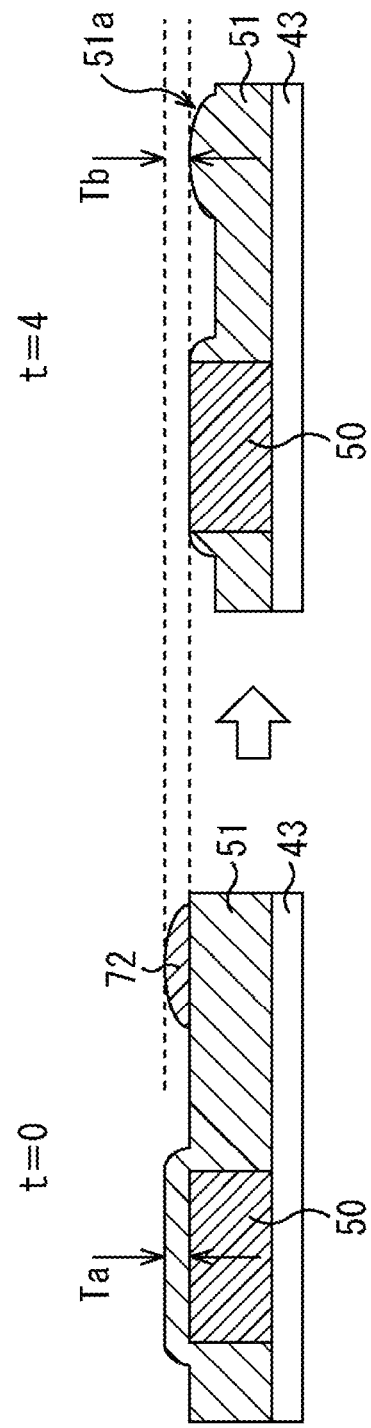
FIG. 10 is a view explaining the relationship between the thickness of the high-refractive-index material on the electrode pad and the etching amount.

Consequently, assuming that, as shown in FIG. 10, the thickness of the high-refractive-index material (high-refractive-index layer 51) on the electrode pad 50 at the start of etching-back (point of time t=0) is indicated by Ta and the etching amount of etching-back is indicated by Tb, a condition for suitably performing the endpoint detection by the EPD and forming the in-layer lenses 51a in a desired lens shape is expressed by Tb>Ta.

The deposition amount of high-refractive-index material and the etching amount of etching-back are not necessarily fixed, which can result in the unevenness of the lens shape. Nevertheless, the endpoint detection of etching under the above-mentioned condition can reduce the unevenness of the shape.

Referring back to the flowchart of FIG. 5, as shown in D of FIG. 6, the planarization film 52 is formed on the high-refractive-index layer 51 in Step S14 and the color filters 53 are formed on the planarization film 52 in Step S15.

In the traditional processes of forming the lens, the large step due to the electrode pad 50 is formed in the high-refractive-index layer 71, and hence it is necessary to form the thick planarization film 52 (D of FIG. 4). On the other hand, in the processes of forming the lens according to the embodiment of the present disclosure, the step due to the electrode pad 50 is hardly formed in the high-refractive-index layer 51, and hence the thin planarization film 52 can be formed.

Then, as shown in E of FIG. 6, the micro lenses 54a are formed in Step S16 and the opening 55 (pad opening) is formed in Step S17.

In the traditional processes of forming the lens, the etching target layers are the micro lens material 54, the planarization film 52, the high-refractive-index layer 71, the antireflection material (not shown), and the like. In the processes of forming the lens according to the embodiment of the present disclosure, the etching target layers are the micro lens material 54, the planarization film 52, and the antireflection material (not shown). Thus, in the processes of forming the lens according to the embodiment of the present disclosure, the etching target layers can be reduced in comparison with the traditional processes of forming the lens.

According to the above-mentioned processes, the planarization film 52 can be formed to be thin, and hence, the distance between the micro lenses 54a and the in-layer lenses 51a can be shorter in comparison with the traditional technique. Therefore, the light collecting properties are improved and the attenuated light is reduced. Thus, more favorable light collecting properties can be provided.

Further, the unevenness of the shape of the in-layer lenses 51a can be reduced. Thus, it is possible to reduce the unevenness of the light collecting properties and suppress color mixture.

In addition, in comparison with the traditional processes of forming the lens, the etching target layers can be fewer. Thus, it is possible to provide effects of reducing an Al etching amount in etching the electrode pad 50, facilitating a polymer separation process due to the reduction of a deposition containing Al, and reducing a corrosion due to the reduction of aluminum fluoride. Further, it is possible to shorten a process time of dry etching in processes of forming the opening 55. Furthermore, the depth of the opening 55 can be reduced, and hence bonding upon mounting the solid-state imaging apparatus 1 can be facilitated.

By the way, an auto-focusing function in a digital camera or the like is realized by a contrast method using a mechanical structure in a system. In recent years, the auto-focussing function is realized by mixing phase difference detection pixels in the pixels of the solid-state imaging apparatus (phase difference detection method). Each of the phase difference detection pixels is, in an upper layer thereof, provided with a light-shielding film and shields light to a light reception section by the light-shielding film.

Hereinafter, a configuration of the solid-state imaging apparatus including the phase difference detection pixels will be described.

Figure 11:
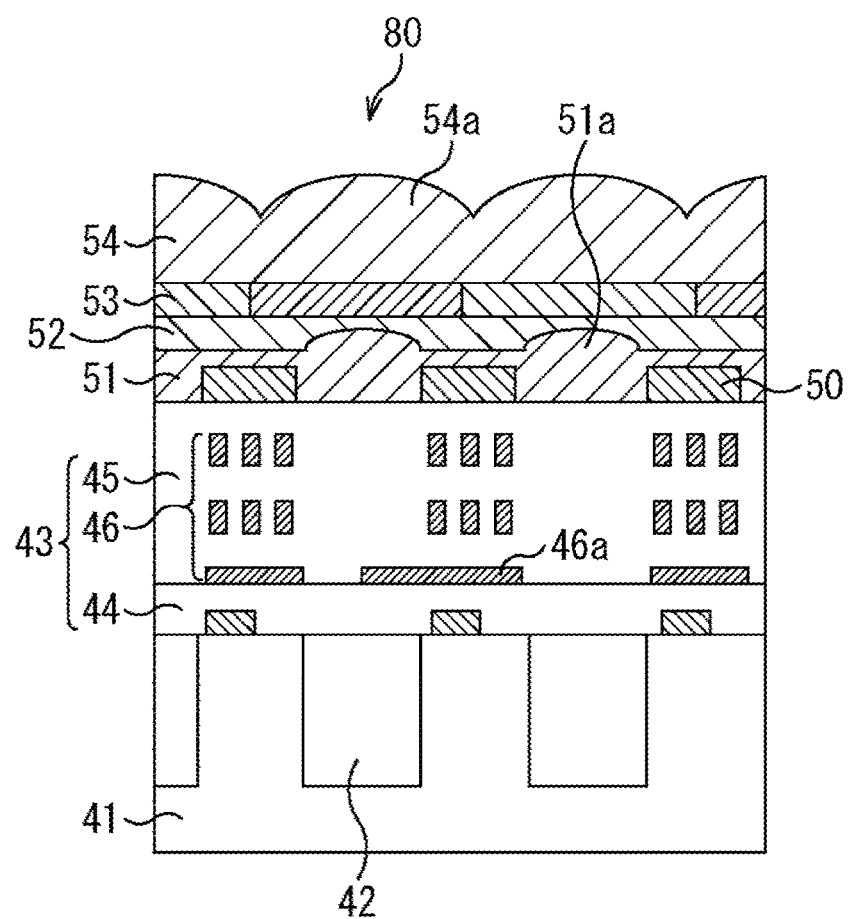
FIG. 11 is a cross-sectional view showing a configuration example of the solid-state imaging apparatus including phase difference detection pixels.

Configuration Example of Solid-State Imaging Apparatus Including Phase Difference Detection Pixels FIG. 11 shows a configuration example of the solid-state imaging apparatus including the phase difference detection pixels.

The phase difference detection pixels are scattered within the plurality of pixels 10 arranged in a matrix form in the imaging region 31 of the solid-state imaging apparatus 1. For example, the phase difference detection pixels include a pixel with a light reception section shielded from light in the right half and a pixel with a light reception section shielded from light in the left half. By replacing some of the pixels 10 by these pixels in predetermined one of pixel rows in the solid-state imaging apparatus 1, the pixels are regularly arranged in a predetermined pattern.

FIG. 11 shows a cross-section of a phase difference detection pixel 80 in which part (specifically, almost right half) of a light reception surface of a photodiode 42 is shielded from light.

Note that descriptions of the same portions of the phase difference detection pixel 80 shown in FIG. 11 as those of the pixel 10 described with reference to FIG. 3 will be omitted.

In the phase difference detection pixel 80 shown in FIG. 11, one of the wiring layers 46 is formed as a light-shielding section that shields the part of the light reception surface of the photodiode 42 from light.

In the phase difference detection pixel 80, the part of the light reception surface is shielded from light, and hence a reduction in sensitivity is inevitable. However, the light collecting properties can be improved by the in-layer lenses 51a according to the embodiment of the present disclosure, and hence the reduction in sensitivity due to light shielding can be suppressed.

Figure 12:
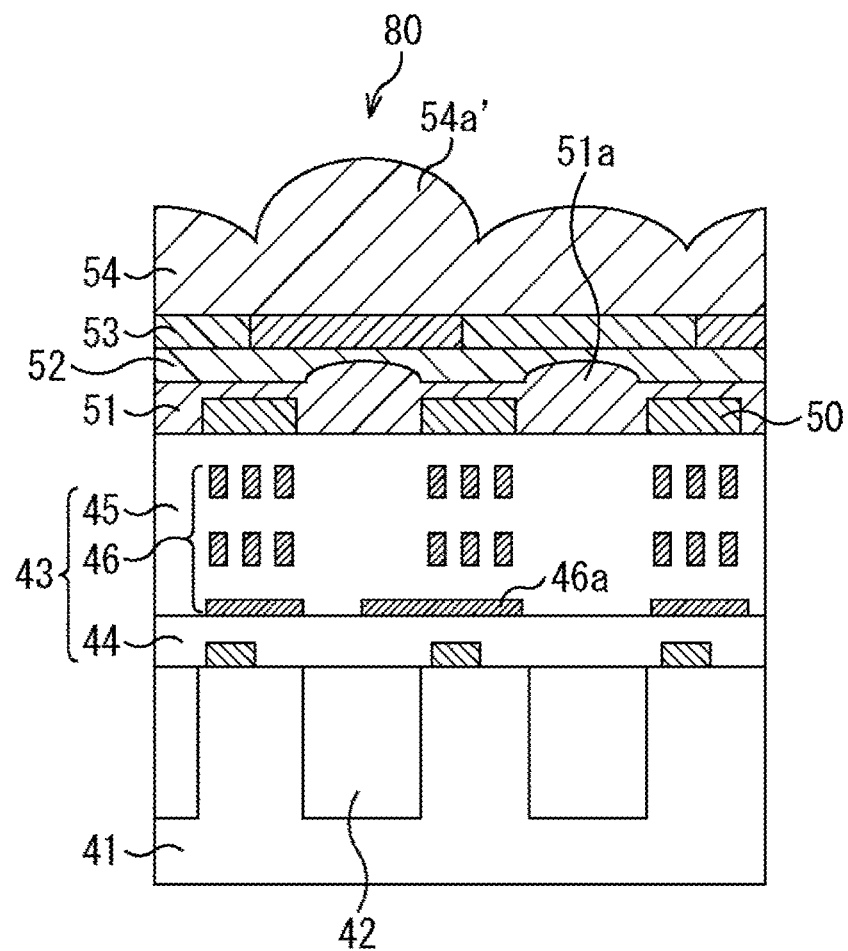
FIG. 12 is a cross-sectional view showing another configuration example of the solid-state imaging apparatus including the phase difference detection pixels.

Another Configuration Example of Solid-State Imaging Apparatus Including Phase Difference Detection Pixels FIG. 12 shows another configuration example of the solid-state imaging apparatus including the phase difference detection pixels.

In a phase difference detection pixel 80 shown in FIG. 12, a micro lens 54a' having a curvature smaller than that of micro lenses 54a of other pixels 10.

With such a configuration, the light collecting properties can be further improved and the reduction in sensitivity due to light shielding can be further suppressed.

Figure 13:
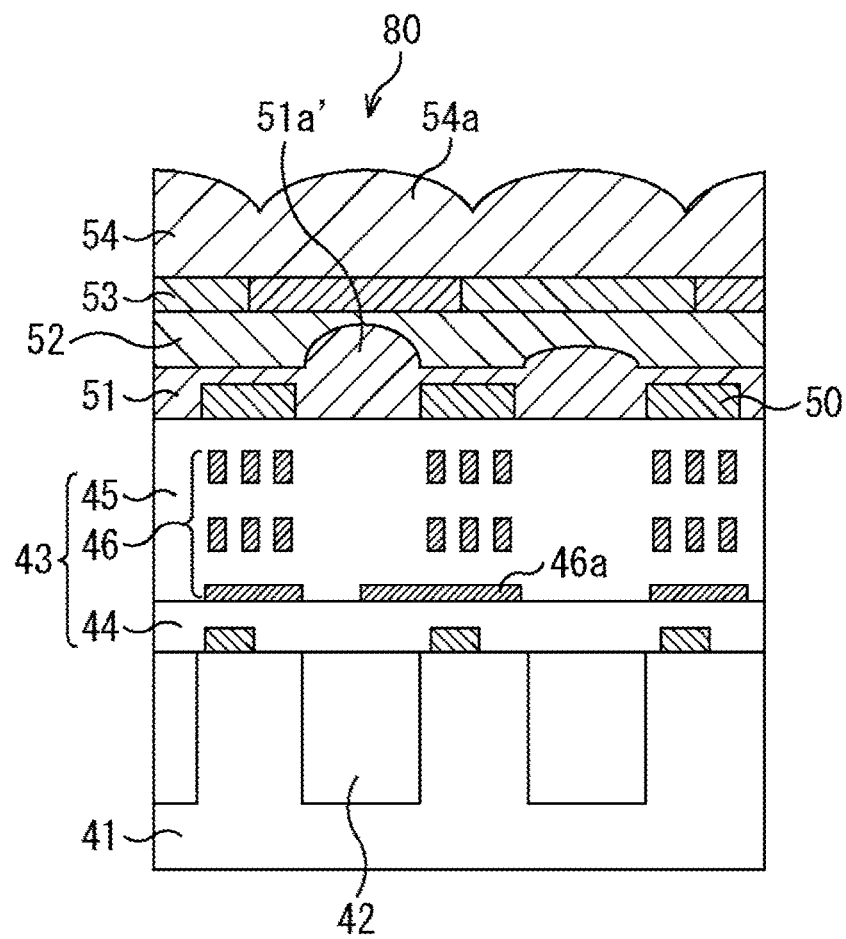
FIG. 13 is a cross-sectional view showing another configuration example of the solid-state imaging apparatus including the phase difference detection pixels.

Still Another Configuration Example of Solid-State Imaging Apparatus Including Phase Difference Detection Pixels FIG. 13 shows still another configuration example of the solid-state imaging apparatus including the phase difference detection pixels.

In a phase difference detection pixel 80 shown in FIG. 13, an in-layer lens 51a' having a curvature smaller than that of in-layer lenses 51a of other pixel 10 is formed.

Also with such a configuration, the light collecting properties can be further improved and the reduction in sensitivity due to light shielding can be further suppressed.

Figure 14:
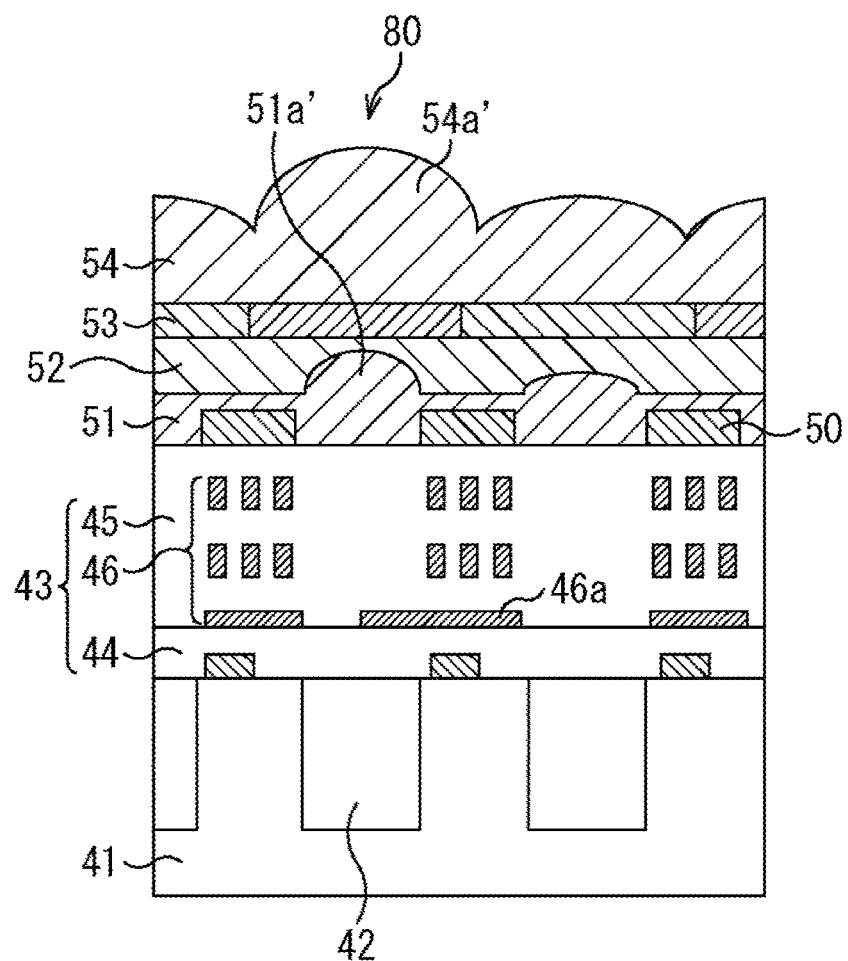
FIG. 14 is a cross-sectional view showing another configuration example of the solid-state imaging apparatus including the phase difference detection pixels.

Still Another Configuration Example of Solid-State Imaging Apparatus Including Phase Difference Detection Pixels FIG. 14 shows still another configuration example of the solid-state imaging apparatus including the phase difference detection pixels.

In a phase difference detection pixel 80 shown in FIG. 14, an in-layer lens 51a' having a curvature smaller than that of in-layer lenses 51a of other pixels 10 is formed and a micro lens 54a' having a curvature smaller than that of micro lenses 54a of other pixels 10 is formed.

With such a configuration, the light collecting properties can be further improved and the reduction in sensitivity due to light shielding can be further suppressed.

[Ensuring Passivation Properties]

The high-refractive-index material for forming the in-layer lenses 51a according to the embodiment of the present disclosure does not have passivation properties in some cases. In these cases, as shown in FIG. 15, a solid-state imaging apparatus 1 can have a structure in which the high-refractive-index material is applied to the passivation layer.

Descriptions of the same portions of the solid-state imaging apparatus 1 shown in FIG. 15 as those of the solid-state imaging apparatus 1 described with reference to FIG. 3 will be omitted.

Figure 15:
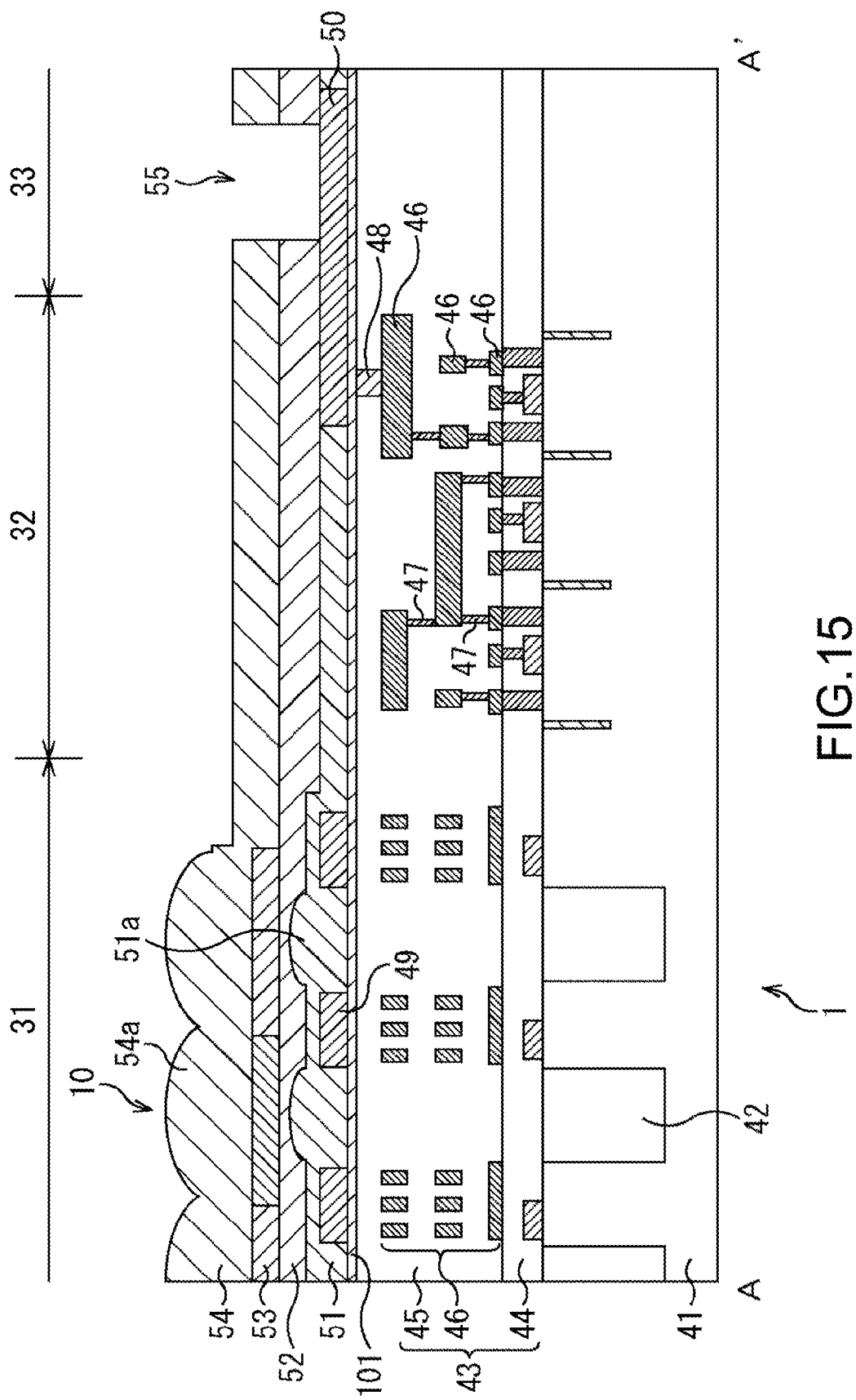
FIG. 15 is a cross-sectional view showing another configuration example of the solid-state imaging apparatus.

In the solid-state imaging apparatus 1 in FIG. 15, before an electrode pad 50 (wiring layers 49) is formed, a passivation layer 101 of a silicon nitride film or the like is formed.

With such a structure, even if the high-refractive-index material does not have passivation properties, the passivation properties can be ensured.

Figure 16:
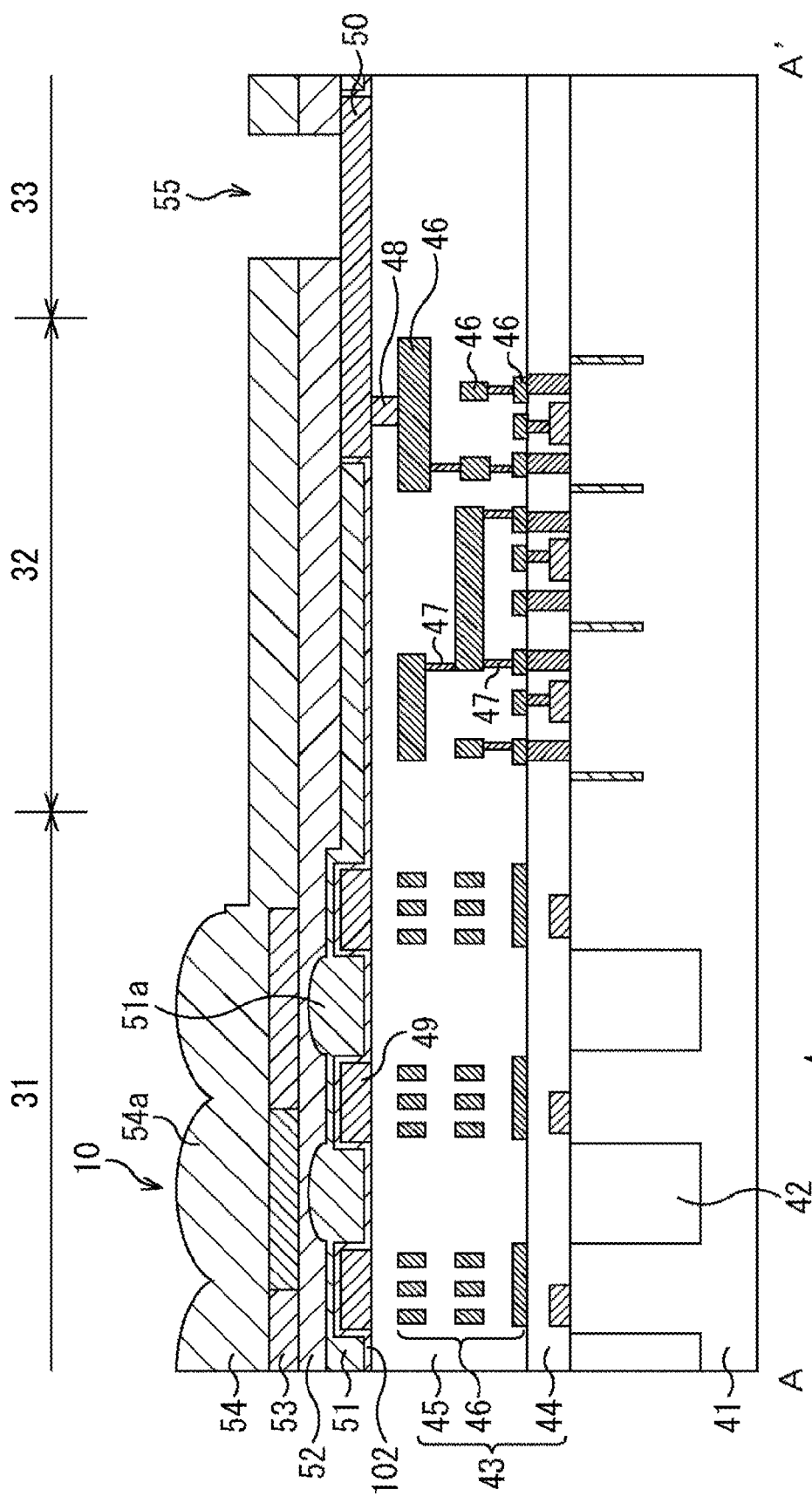
FIG. 16 is a cross-sectional view showing another configuration example of the solid-state imaging apparatus.

Alternatively, the solid-state imaging apparatus 1 may have a structure shown in FIG. 16.

In a solid-state imaging apparatus 1 in FIG. 16, after an electrode pad 50 (wiring layers 49) is formed, a passivation layer 102 of a silicon nitride film or the like is formed.

In this case, the passivation layer 102 on an upper surface of the electrode pad 50 is removed during etching-back in forming the in-layer lenses 51a. Only a small region of the passivation layer 102 is removed and the passivation layer 102 on side surfaces of the electrode pad 50 remains. Thus, it is possible to sufficiently ensure the passivation properties.

[Film Separation During Dicing]

In general, a relatively soft organic material is used as the material for the planarization film in a semiconductor apparatus. Due to its softness, the cutting surface of the planarization film can be broken by physical force applied from a dicing blade to the planarization film upon dicing. As a result, the planarization film itself may be separated or the upper and lower layers may be separated.

Figure 17:
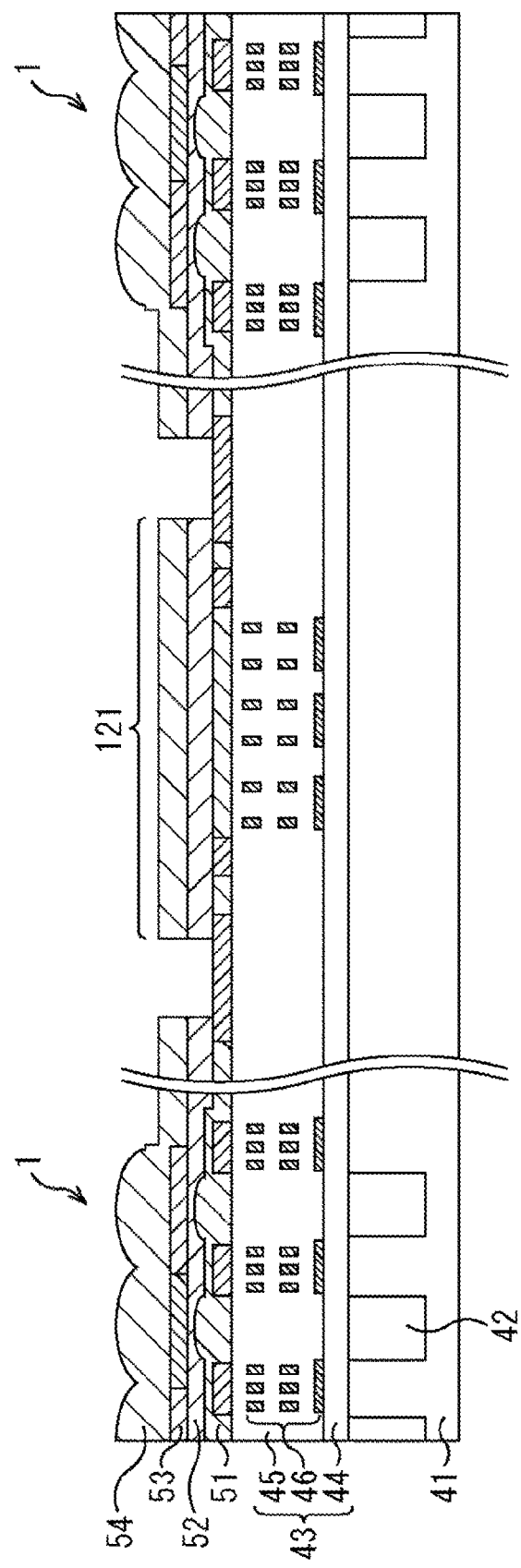
FIG. 17 is a view explaining a scribe line.

FIG. 17 shows a cross-sectional view of the solid-state imaging apparatus 1 before dicing.

As shown in FIG. 17, a scribe line 121 is provided between the solid-state imaging apparatus 1 and another solid-state imaging apparatus 1. Upon dicing, the solid-state imaging apparatus 1 is divided into chips and the scribe line 121 is cut by the dicing blade.

In the embodiment of the present disclosure, the planarization film 52 is formed to have a small thickness, and hence an area in which the planarization film 52 and the dicing blade are in contact with each other is also small. Thus, the physical force applied from the dicing blade to the planarization film can be reduced. As a result, film separation of the planarization film 52 can be suppressed.

Although the configuration in which the embodiment of the present disclosure is applied to the front side illumination CMOS image sensor has been described above, the embodiment of the present disclosure may be applied to a solid-state imaging apparatus such as a back side illumination CMOS image sensor and a charge coupled device (CCD) image sensor.

Further, the embodiment of the present disclosure is not limited to be applied to the solid-state imaging apparatus and is also applicable to an imaging apparatus. The imaging apparatus means a camera system such as a digital still camera and a digital video camera or an electronic apparatus having an imaging function such as a cellular phone. Note that modules installed on the electronic apparatus, that is, camera modules may be used as the imaging apparatus.

Configuration Example of Electronic Apparatus

Now, referring to FIG. 18, a configuration example of an electronic apparatus to which an embodiment of the present disclosure is applied will be described.

An electronic apparatus 200 shown in FIG. 18 includes an optical lens 201, a shutter apparatus 202, a solid-state imaging apparatus 203, a driving circuit 204, and a signal processing circuit 205. FIG. 18 shows the embodiment in the case where the solid-state imaging apparatus 1 according to the above-mentioned embodiment of the present disclosure is provided to an electronic apparatus (digital still camera) as a solid-state imaging apparatus 203.

The optical lens 201 focuses image light (incident light) from a subject on an imaging surface of the solid-state imaging apparatus 203 and forms an image. With this, signal charges are accumulated in the solid-state imaging apparatus 203 for a predetermined period. The shutter apparatus 202 controls a light illumination period and a light shielding period with respect to the solid-state imaging apparatus 203.

The driving circuit 204 supplies a driving signal for controlling a signal transferring operation of the solid-state imaging apparatus 203 and a shutter operation of the shutter apparatus 202. According to the driving signal (timing signal) supplied from the driving circuit 204, the solid-state imaging apparatus 203 transfers the signal. The signal processing circuit 205 performs various types of signal processing on the signal output from the solid-state imaging apparatus 203. A video signal resulting from signal processing is stored in a storage medium such as a memory or output to a monitor.

In the electronic apparatus 200 according to this embodiment, more favorable light collecting properties can be provided in the solid-state imaging apparatus 203. Consequently, the image quality can be improved.

Note that embodiments of the present disclosure are not limited to the above-mentioned embodiments and may be variously changed without departing from the gist of the present disclosure.

Note that the present disclosure may also take the following configurations.

(1) A solid-state imaging apparatus, including:
an imaging region in which pixels are arranged;
a connection region that surrounds the imaging region and includes an electrode pad; and
an in-layer lens that is formed in the imaging region for each of the pixels, the in-layer lens being formed of a coating-type high-refractive-index material, the connection region including an opening that is formed such that an upper surface of the electrode pad is exposed from the high-refractive-index material applied to the electrode pad.
(2) The solid-state imaging apparatus according to (1), further including:
  a planarization film that is formed on the high-refractive-index material; and
  a color filter and a micro lens that are formed on the planarization film in the imaging region for each of the pixels, in which
  the opening is formed by etching materials of the planarization film and the micro lens in the connection region.
(3) The solid-state imaging apparatus according to (2), in which
  the upper surface of the electrode pad is partially in contact with the planarization film.
(4) The solid-state imaging apparatus according to (1), in which
  the imaging region includes, as one of the pixels, a phase difference detection pixel having a light reception surface partially shielded from light.
(5) The solid-state imaging apparatus according to (4), in which
  the micro lens of the phase difference detection pixel is formed to have a curvature smaller than a curvature of the micro lenses of the other pixels.
(6) The solid-state imaging apparatus according to (4) or (5), in which
  the in-layer lens of the phase difference detection pixel is formed to have a curvature smaller than a curvature of the in-layer lenses of the other pixels.
(7) The solid-state imaging apparatus according to any one of (1) to (6), further including
  a passivation layer, in which
  the high-refractive-index material is applied to the passivation layer.
(8) The solid-state imaging apparatus according to any one of (1) to (7), in which
  the high-refractive-index material contains a metal oxide film particle.
(9) A method of manufacturing a solid-state imaging apparatus including an imaging region in which pixels are arranged, a connection region that surrounds the imaging region and includes an electrode pad, and an in-layer lens that is formed in the imaging region for each of the pixels, the method including:
  forming the in-layer lens by etching back the coating-type high-refractive-index material; and
  forming, in the connection region, an opening such that the upper surface of the electrode pad is exposed by etching back the high-refractive-index material applied to the electrode pad.
(10) The method of manufacturing a solid-state imaging apparatus according to (9), in which
  in etching back the high-refractive-index material applied to the electrode pad, an emission wavelength caused by the electrode pad being attacked by plasma is monitored.
(11) The method of manufacturing a solid-state imaging apparatus according to (10), in which
  the high-refractive-index material on the electrode pad is set to have a thickness smaller than a thickness corresponding to an etching amount in etching back the high-refractive-index material.
(12) An electronic apparatus, including:
  an imaging region in which pixels are arranged;
  a connection region that surrounds the imaging region and includes an electrode pad; and
  an in-layer lens that is formed in the imaging region for each of the pixels, the in-layer lens being formed of a coating-type high-refractive-index material, the connection region including an opening that is formed such that an upper surface of the electrode pad is exposed from the high-refractive-index material applied to the electrode pad.

It should be understood by those skilled in the art that various modifications, combinations, sub-combinations and alterations may occur depending on design requirements and other factors insofar as they are within the scope of the appended claims or the equivalents thereof.

What is claimed is:

1. A method of manufacturing a solid-state imaging apparatus including an imaging region in which pixels are arranged, a connection region that surrounds the imaging region and includes an electrode pad, and an in-layer lens that is formed in the imaging region for each of the pixels, the method comprising:
  forming a refractive-index layer including a refractive-index material in the imaging region and the connection region, wherein the refractive-index material is formed on the electrode pad;
  forming the in-layer lens and an opening that exposes an upper surface of the electrode pad in the connection region by etching back the refractive-index material in the imaging region and in the connection region; and
  monitoring an emission wavelength caused by the electrode pad being etched by plasma while etching back the refractive-index material formed on the electrode pad.

2. The method of manufacturing a solid-state imaging apparatus according to claim 1, wherein the refractive-index material on the electrode pad is set to have a thickness smaller than a thickness corresponding to an etching amount in etching back the refractive-index material.

* * * * *